US012715816B2

(12) United States Patent
Duan et al.

(10) Patent No.: US 12,715,816 B2
(45) Date of Patent: Aug. 25, 2026

(54) CERAMIC ARTICLE, SEMICONDUCTOR APPARATUS FOR MANUFACTURING A SEMICONDUCTOR STRUCTURE AND METHOD OF MANUFACTURING A CERAMIC ARTICLE

(71) Applicant: TAIWAN SEMICONDUCTOR MANUFACTURING COMPANY LTD., Hsinchu (TW)

(72) Inventors: Ren-Guan Duan, Hsinchu (TW); Li-Chun Wang, Hsinchu City (TW); Chen-Hsiang Lu, Hsin-Chu City (TW); Tien-Chih Cheng, Hsinchu City (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 1042 days.

(21) Appl. No.: 17/811,084

(22) Filed: Jul. 7, 2022

(65) Prior Publication Data

US 2024/0010566 A1 Jan. 11, 2024

(51) Int. Cl.
*C04B 35/443* (2006.01)
*C04B 41/00* (2006.01)
*H10W 99/00* (2026.01)

(52) U.S. Cl.
CPC ........ *C04B 35/443* (2013.01); *C04B 41/0054* (2013.01); *C04B 41/0072* (2013.01); (Continued)

(58) Field of Classification Search
CPC ........................ C04B 35/443; C04B 2235/666
See application file for complete search history.

(56) References Cited

U.S. PATENT DOCUMENTS

2010/0156008 A1* 6/2010 Aalund .................... H05H 1/46 264/483
2019/0070818 A1* 3/2019 Bram .................... B30B 15/022
2023/0242409 A1* 8/2023 Walker .................... C01F 7/162 264/655

FOREIGN PATENT DOCUMENTS

CN 119980470 A * 5/2025
WO 2022015688 A1 1/2022

OTHER PUBLICATIONS

Guillon,O., et al., Filed-Assisted Sintering Technology/Spark Plasma Sintering: Mechanisms, Material, and Technology Developments, Advanced Engineering Materials 2014, vol. 16, No. 7 pp. 830-849.

* cited by examiner

*Primary Examiner* — Melvin C. Mayes
(74) *Attorney, Agent, or Firm* — WPAT LAW; Anthony King

(57) ABSTRACT

A ceramic article includes a ceramic body including a spinel ($MgAl_2O_4$) structure, wherein a ratio of a density of the spinel structure to a theoretical density of a spinel is greater than 99.5%. A semiconductor apparatus for manufacturing a semiconductor structure includes a ceramic article including a spinel ($MgAl_2O_4$) structure, wherein a ratio of a density of the spinel structure to a theoretical density of a spinel is greater than 99.5%. A method of manufacturing a ceramic article includes providing a green body; heating the green body to a sintering temperature; compressing the green body; applying a electrical pulse to the green body; and forming a ceramic body including a spinel ($MgAl_2O_4$) structure after heating, compressing and applying the electrical pulse to the green body.

20 Claims, 16 Drawing Sheets

(52) U.S. Cl.
CPC ..... *H10W 99/00* (2026.01); *C04B 2235/3222* (2013.01); *C04B 2235/666* (2013.01); *C04B 2235/763* (2013.01); *C04B 2235/77* (2013.01); *C04B 2235/785* (2013.01); *C04B 2235/786* (2013.01); *C04B 2235/787* (2013.01)

CERAMIC ARTICLE, SEMICONDUCTOR APPARATUS FOR MANUFACTURING A SEMICONDUCTOR STRUCTURE AND METHOD OF MANUFACTURING A CERAMIC ARTICLE

BACKGROUND

In the semiconductor industry, devices are fabricated by a number of manufacturing processes producing structures of an ever-decreasing size. Some manufacturing processes, such as plasma etch and plasma clean processes, subject a substrate to a high-speed stream of plasma to etch or clean the substrate. The plasma may be highly corrosive, and may corrode processing chambers and other surfaces that are exposed to the plasma. Therefore, selection of a material used for apparatus components and chamber liners becomes more critical. Therefore, there is a need to develop materials with good plasma resistance while maintaining adequate mechanical, electrical and thermal properties. Such materials can reduce particle generation and metal contamination and provide prolonged component life.

BRIEF DESCRIPTION OF THE DRAWINGS

Aspects of the present disclosure are best understood from the following detailed description when read with the accompanying figures. It should be noted that, in accordance with the standard practice in the industry, various structures are not drawn to scale. In fact, the dimensions of the various structures may be arbitrarily increased or reduced for clarity of discussion.

DETAILED DESCRIPTION

Figure 1:
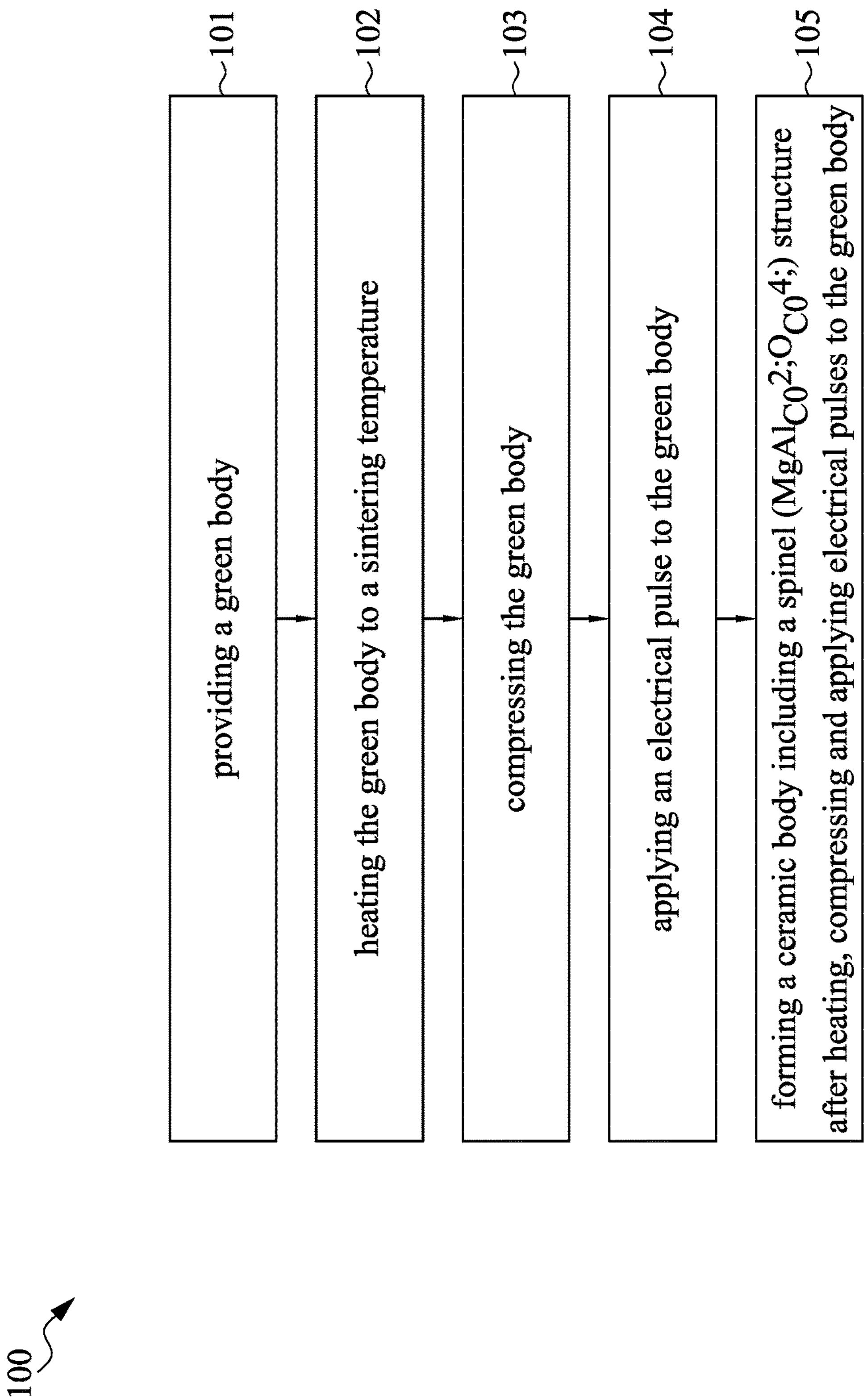
FIG. 1 is a flowchart showing various steps of a method for manufacturing a ceramic article in accordance with some embodiments of the present disclosure.

The following disclosure provides many different embodiments, or examples, for implementing different features of the provided subject matter. Specific examples of elements and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "over," "upper," "on" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, although the terms such as "first," "second" and "third" describe various elements, components, regions, layers and/or sections, these elements, components, regions, layers and/or sections should not be limited by these terms. These terms may be only used to distinguish one element, component, region, layer or section from another. The terms such as "first," "second" and "third" when used herein do not imply a sequence or order unless clearly indicated by the context.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in the respective testing measurements. Also, as used herein, the terms "substantially," "approximately" and "about" generally mean within a value or range that can be contemplated by people having ordinary skill in the art. Alternatively, the terms "substantially," "approximately" and "about" mean within an acceptable standard error of the mean when considered by one of ordinary skill in the art. People having ordinary skill in the art can understand that the acceptable standard error may vary according to different technologies. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the terms "substantially," "approximately" or "about." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as from one endpoint to another endpoint or between two endpoints. All ranges disclosed herein are inclusive of the endpoints, unless specified otherwise.

Semiconductor processing subjects manufacturing equipment, such as processing chambers and components within the processing chambers, to a variety of chemical reagents and plasma ions which attack surfaces of the chambers and components, causing erosion of such surfaces. It is possible to reduce rates of the erosion by selecting particular materials of the manufacturing equipment.

Further, as semiconductor device geometries are reduced, susceptibility to defects increases, and allowable levels of particle contamination may be accordingly reduced. To minimize particle contamination introduced by plasma etch and/or plasma clean processes, it is necessary to develop a material having superior plasma erosion resistance that can be used in the manufacturing equipment.

In the present disclosure, a ceramic article and an apparatus for manufacturing a semiconductor structure are provided. The ceramic article includes a spinel ($MgAl_2O_4$) structure, wherein a ratio of a density of the spinel structure to a theoretical density of a spinel is greater than 99.5%. A method of manufacturing the ceramic article is also provided.

FIG. 1 is a flowchart showing a method 100 of manufacturing a ceramic article in accordance with some embodiments of the present disclosure. The method 100 includes several operations: (101) providing a green body; (102) heating the green body to a sintering temperature; (103) compressing the green body; (104) applying DC pulse currents to the green body; and (105) forming a ceramic body including a spinel ($MgAl_2O_4$) structure after heating, compressing and applying DC pulse currents to the green body.

Figure 2:
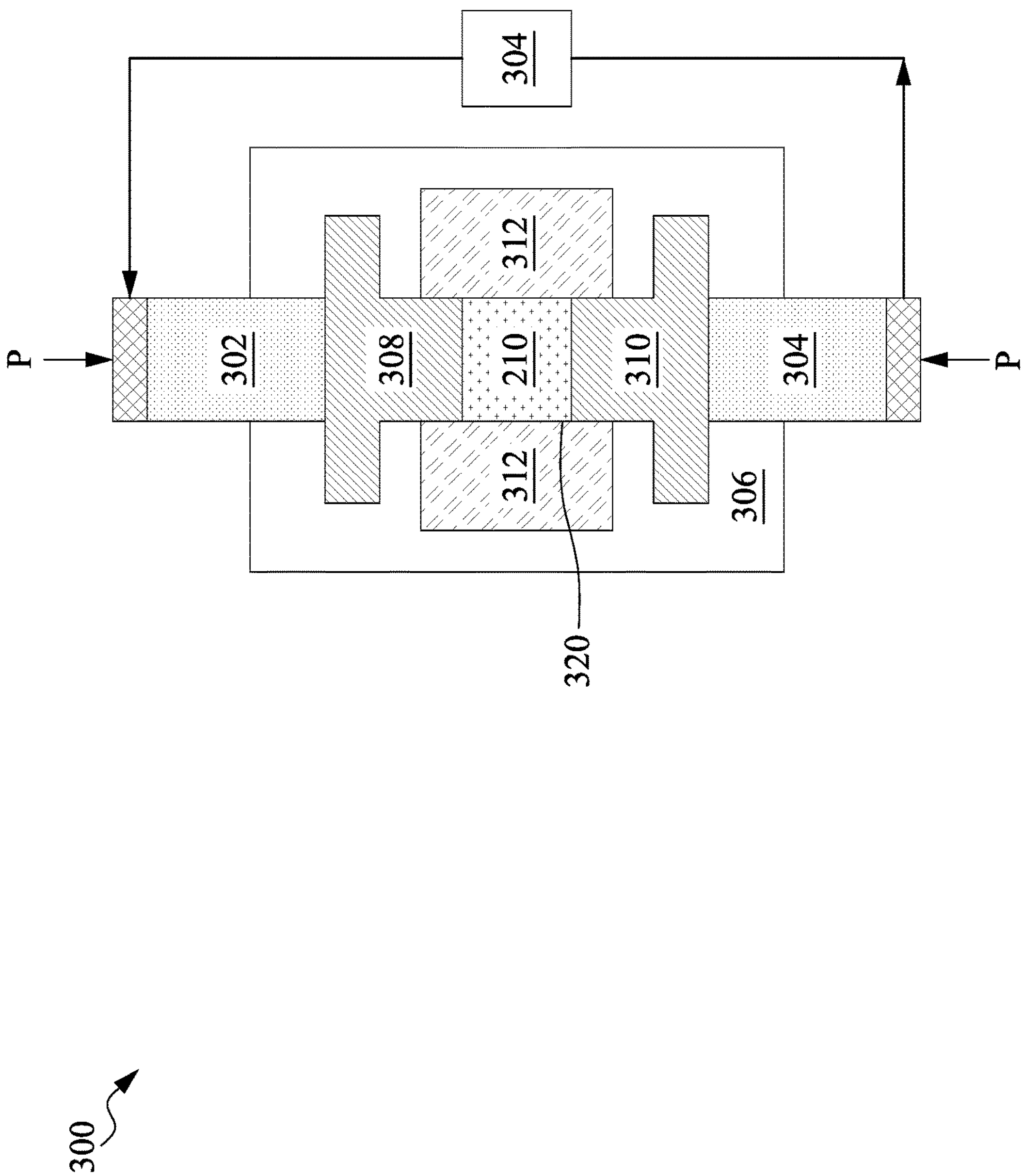
FIGS. 2 to 4 are schematic views of one or more operations of the method for manufacturing a ceramic article in accordance with some embodiments of the present disclosure.

FIG. 2 is a schematic view of one or more operations of the method for manufacturing a ceramic article using the method 100 in accordance with some embodiments of the present disclosure. In operation 101, referring to FIG. 2, a green body 210 is provided. In some embodiments, the green body 210 includes a magnesium source and an aluminum source. In some embodiments, the magnesium source and the aluminum source are mixed. In some embodiments, the magnesium source and the aluminum source are thoroughly mixed, and the green body 210 is homogeneous. In some embodiments, the green body 210 includes 28 to 35 wt % of the magnesium source and 65 to 72 wt % of the aluminum source based on 100% by weight of both of the magnesium source and the aluminum source.

In some embodiments, the magnesium source is selected from the group consisting of magnesium hydroxide, magnesium oxide, magnesium carbonate, basic magnesium carbonate, magnesium nitrate, magnesium acetate, magnesium sulfate, and combinations thereof. In some embodiments, the aluminum source is selected from the group consisting of aluminum hydroxide, aluminum oxide, aluminum carbonate, aluminum nitrate, aluminum acetate, aluminum sulfate, and combinations thereof. The magnesium source is preferably in the form of fine particles, and the particle size thereof is preferably 0.5 to 100 μm in terms of a volume-based cumulative 50% particle diameter (D50). The aluminum source is preferably in the form of fine particles, and the particle size thereof is preferably 0.3 to 15 μm in terms of a volume-based cumulative 50% particle diameter (D50).

In some embodiments, the green body 210 includes a raw material. In some embodiments, the green body 210 includes a magnesium-aluminum composite oxide having a spinel-type crystal structure. In some embodiments, the green body 210 includes a spinel structure.

In some embodiments, the method 100 includes positioning the green body 210 in a die 312. In some embodiments, the die 312 includes graphite. In some embodiments, the method 100 includes positioning the green body 210 in a spark plasma sintering processing apparatus 300.

In some embodiments, the spark plasma sintering processing apparatus 300 includes an upper electrode 302, a lower electrode 304, a vacuum chamber 306, a DC pulse generator 314, and the die 312. The upper electrode 302 includes an upper punch 308, and the lower electrode 304 includes a lower punch 310. In some embodiments, the die 312, the upper punch 308 and lower punch 310 define a sintering chamber 320. In some embodiments, the green body 210 is placed in the sintering chamber 320 during processing. In some embodiments, the green body 210, the die 312, the upper punch 308 and the lower punch 310 are disposed in the vacuum chamber 306. The DC pulse generator 314 provides electrical pulse. The DC pulse generator 314 is electrically connected to the upper electrode 302 and the lower electrode 304.

In operation 102, the green body 210 is heated to a sintering temperature. In some embodiments, the sintering temperature is between 1200° C. and 1800° C. In some embodiments, the green body 210 is heated from room temperature to the sintering temperature at a ramp rate ranging between 1° C./min and 60° C./min. In some embodiments, the green body 210 is heated in the sintering chamber 320 of the spark plasma sintering processing apparatus 300. In some embodiments, the green body 210 is heated for less than 130 minutes. In some embodiments, the green body 210 is heated for 2 to 120 minutes. In some comparative embodiments, a spinel structure formed by pressless sintering or hot press sintering takes more than 14 hours to manufacture.

In operation 103, the green body 210 is compressed. In some embodiments, a pressure of the compression of the green body 210 is between 5 and 100 MPa. In some embodiments, the green body 210 is compressed in the sintering chamber 320 of the spark plasma sintering processing apparatus 300. In some embodiments, a pressure P is applied by a lower electrode 304 and an upper electrode 302, and the green body 210 housed in the sintering chamber 320 is compressed by the upper punch 308 and the lower punch 310.

In operation 104, an electrical pulse is applied to the green body 210. In some embodiments, the electrical pulse is an ON-OFF DC pulse current. In some embodiments, the electrical pulse is applied to the green body 210 during an ON TIME and stops during an OFF TIME, and the ON TIME and the OFF TIME of the electrical pulse occur in turn repeatedly. In some embodiments, a current of the electrical pulse is between 0.1 and 11 kA. In some embodiments, a voltage of the electrical pulse is between 0 and 10 V. In some embodiments, the electrical pulse is applied to the green body 210 housed in the sintering chamber 320 by the DC pulse generator 314. The DC pulse generator 314 transmits the electrical pulse through the upper electrode 302, through the die 312, and into the lower electrode 304. The resistance of the green body 210 housed in the sintering chamber 320 heats the sintering chamber 320 when the electrical pulse is applied by the DC pulse generator 314. The sintering temperature may be controlled by variations is several parameters of the electrical pulse including, but not limited to, electrical pulse holding time, pulsing ramp rate, pulse duration, and pulse current and voltage. In some embodiments, discharging the electrical pulse generates spark plasma, spark impact pressure, Joule heating, and/or an electrical field diffusion effect.

In some embodiments, the operation 102, the operation 103, and the operation 104 are performed simultaneously. In some embodiments, the electrical pulse is applied to the green body 210 intermittently, the green body 210 is heated due to receiving the electrical pulse while being compressed at the same time. In some embodiments, the method 100 includes starting a spark plasma sintering process to sinter the green body 210. In some embodiments, during spark plasma sintering processing, the green body 210 is compressed and receives the electrical pulse, and is thereby heated.

In some embodiments, in order to conduct the spark plasma sintering process, the method 100 includes evacuation of the vacuum chamber 306, application of the pressure to the green body 210 disposed in the sintering chamber 320, application of the electrical pulse to the green body 210 disposed in the sintering chamber 320, and cooling the green body 210 disposed in the sintering chamber 320. Regarding the evacuation, the vacuum chamber 306 may be evacuated of air to form a vacuum condition. As used herein, a vacuum condition does not refer to a theoretic vacuum (P=0), but rather a low pressure common in laboratory vacuum conditions such as less than about 5%, less than about 1%, or even less than about 0.1% of atmospheric pressure.

Figure 3:
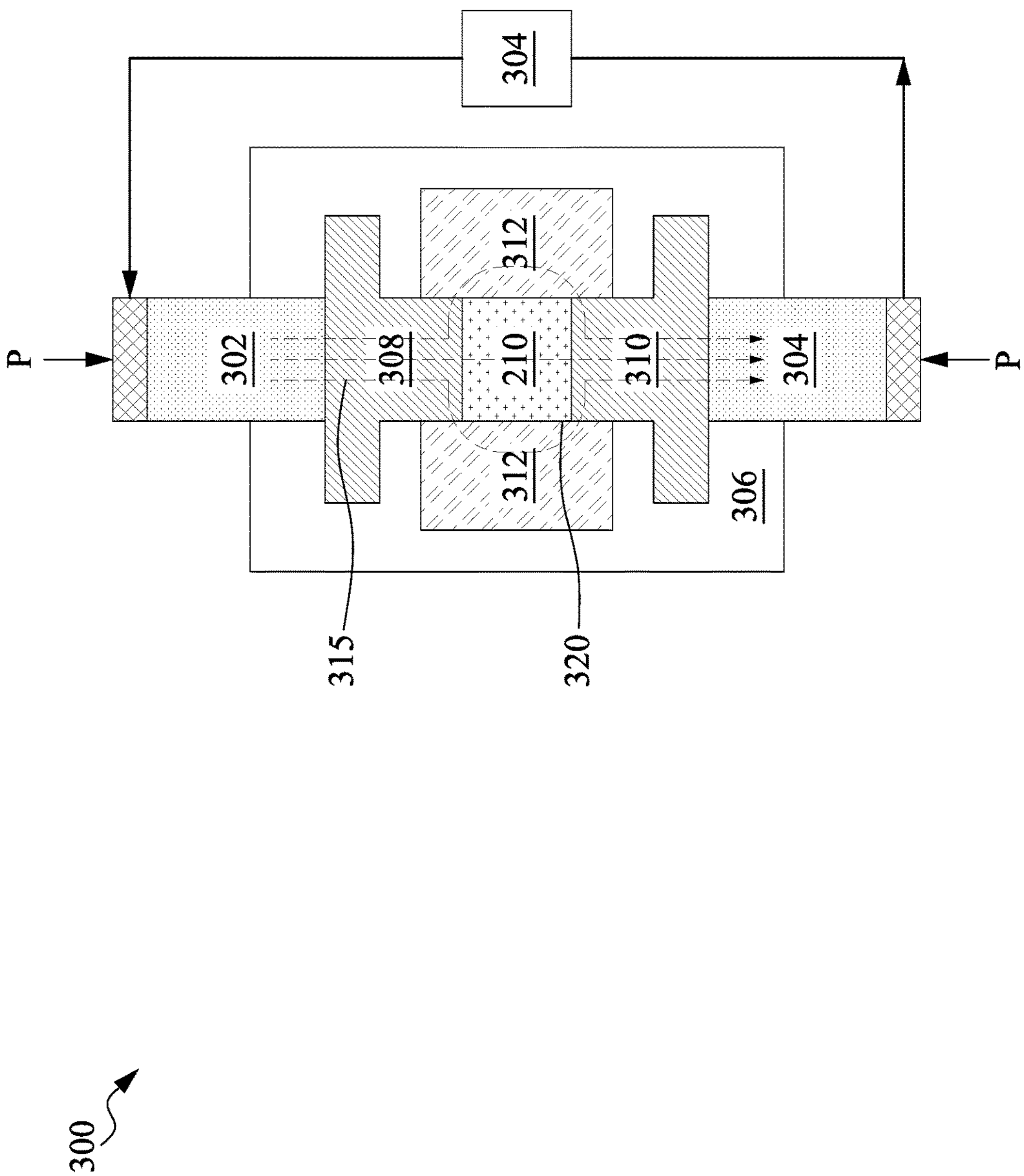
Figure 4:
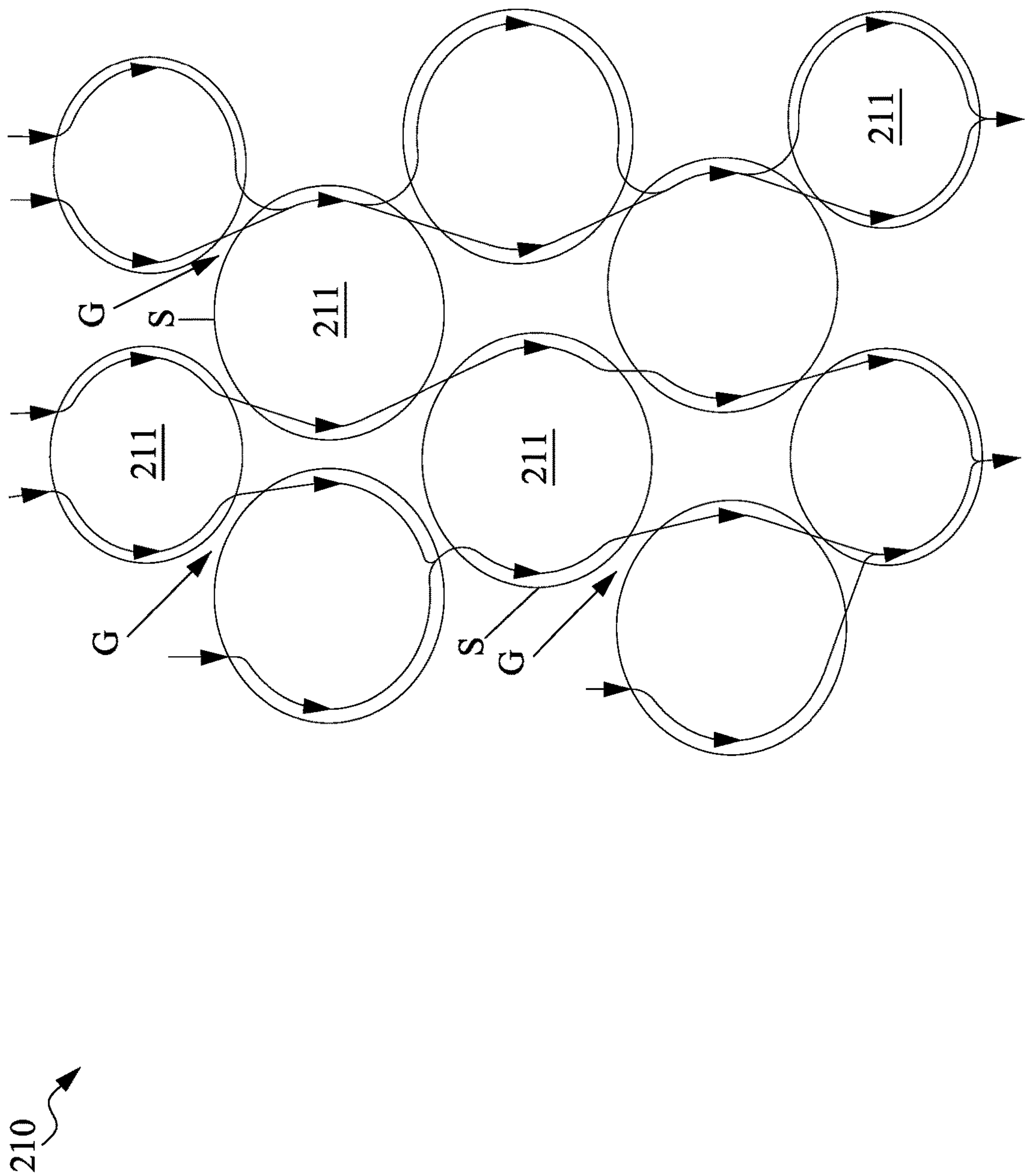

FIG. 3 is a schematic view illustrating a path 315 of the electrical pulse during the spark plasma sintering process. FIG. 4 is a schematic view illustrating particles 211 of the green body 210 during the spark plasma sintering process. In some embodiments, referring to FIGS. 3 and 4, the green body 210 includes the particles 211. In some embodiments, initiation of a spark discharge in a gap G between the particles 211 is assisted by fine impurities and gases on and between particle surfaces S of the particles 211. The spark discharge creates a momentary, local high-temperature state causing vaporization of both the impurities and the surfaces S of the particles 211 in an area of the spark. In some embodiments, immediately behind an area of vaporization, the particle surfaces S melt. Due to electron draw during the ON TIME of the electrical pulse and the vacuum during the OFF TIME of the electrical pulse, the surfaces S are liquidized and drawn together, creating "necks." An ongoing radiant Joule heat and pressure causes the necks to gradually develop and increase. The radiant heat also causes plastic deformation on the surfaces S of the particles 211, which is necessary for forming the spinel structure having high density. In some embodiments, following the heating during the ON TIME of the electrical pulse, a cooling takes place during the OFF TIME of the electrical pulse to solidify the particle surfaces S of the particles 211.

In some embodiments, during the spark plasma sintering process, heat is concentrated primarily on the surfaces S of the particles 211 as shown in FIG. 3. In some embodiments, particle growth is limited due to a speed of the spark plasma sintering process and a fact that only a surface temperature of the particles 211 rises rapidly. In some embodiments, the entire spark plasma sintering process is completed in less than 130 minutes, with high uniformity and without changing the particles' 211 characteristics.

In some embodiments, a force formed by the pressure P also plays an important role in curbing particulate growth and influencing overall densities of the spinel ($MgAl_2O_4$) structure. The force multiplies the spark initiation (diffusion) throughout the green body 210 under pressure, especially during an out-gassing stage. In a large green body 210 where a high density is required, the force is commonly increased in stages to enhance the out-gassing and the electrical diffusion. Accordingly, accurate manipulation of the force can enhance the spark plasma sintering process.

Figure 5:
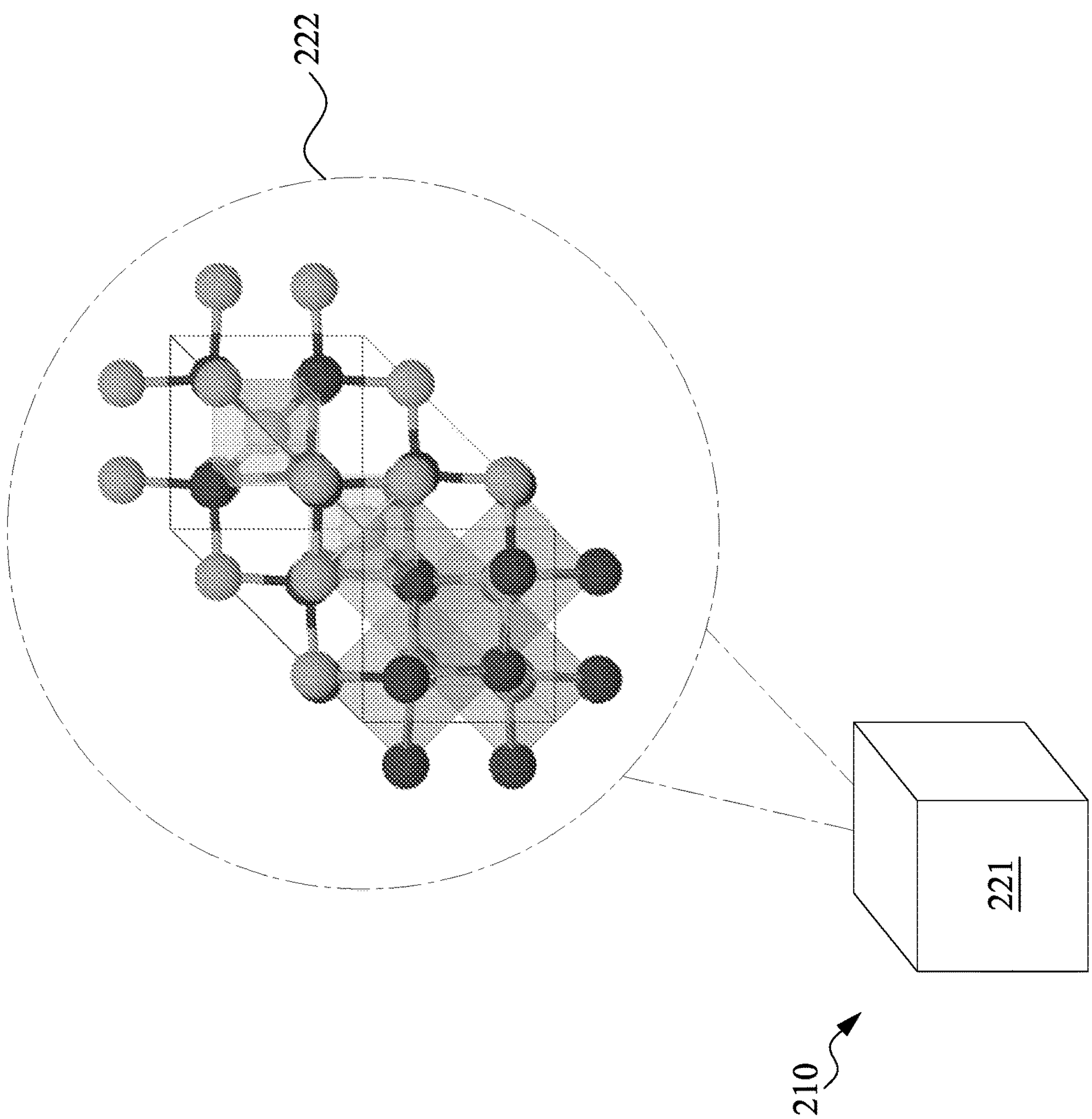
FIG. 5 is a schematic view of a ceramic article in accordance with some embodiments of the present disclosure.

FIG. 5 is a schematic view of a ceramic article 220 in accordance with some embodiments of the present disclosure. In operation 105, a ceramic body 221 including a spinel structure 222 is formed after heating, compressing and applying the electrical pulse to the green body 210. In some embodiments, after heating, compressing and applying the electrical pulse to the green body 210, the green body 210 is cooled from the sintering temperature to less than 100° C. In some embodiments, a cooling rate for cooling the green body 210 is between 1° C./min and 60° C./min. In some embodiments, the green body 210 is cooled from the sintering temperature to room temperature.

In some embodiments, the method 100 includes ending the spark plasma sintering process after the ceramic body 221 is formed. In some embodiments, the ceramic article 220, including the ceramic body 221 with the spinel structure 222, is formed. In some embodiments, the ceramic body 221 is prepared by the spark plasma sintering process. In some embodiments, a ratio of a density of the spinel structure 222 to a theoretical density of a spinel is equal to or greater than 99.5%. In some embodiments, the ratio of a density of the spinel structure 222 to the theoretical density of a spinel is greater than 99.9%. The ceramic article 220 has adequate mechanical, electrical and thermal properties, and due to the high density, the ceramic article 220 also has good plasma erosion resistance, which can reduce particle generation and metal contamination, and provide greater lifetime, of the ceramic article 220. In some comparative embodiments, a density of a spinel structure formed by pressless sintering or hot press sintering to the theoretical density of a spinel is less than 99.5%.

In some embodiments, a grain size of the spinel structure 222 ranges from nano-size to micro-size. In some embodiments, the grain size of the spinel structure 222 is between 0.1 and 50 μm. In some embodiments, a porosity of the ceramic body 221 is less than 0.5 vol %. In some embodiments, the porosity of the ceramic body 221 is less than 0.1 vol %. In some comparative embodiments, a porosity of a spinel structure formed by pressless sintering is greater than 1 vol %. In some comparative embodiments, a porosity of a spinel structure formed by hot press sintering is greater than 0.5 vol %. In some embodiments, the spinel structure 222 of the ceramic body 221 can be controlled to be with or without a preferred grain orientation by manipulating fabrication parameters of the spark plasma sintering process. In some embodiments, the spinel structure 222 of the ceramic body 221 has the preferred grain orientation. In some comparative embodiments, it is not possible to control whether a spinel structure formed by pressless sintering or hot press sintering has a preferred grain orientation.

In some comparative embodiments, yttrium aluminum garnet (YAG, $Y_3Al_5O_{12}$) is known to have a plasma erosion resistance to F*, Cl*, H* plasma, however, the plasma erosion resistance of YAG to F*, Cl*, H* plasma is less than that of the spinel structure 222. In some comparative embodiments, an ion bombardment resistance of YAG is less than that of the spinel structure 222. Properties of the spinel structure 222 of the ceramic body 221 are listed in Table 1, and properties of YAG are also listed for comparison with the spinel structure 222 of the present disclosure.

TABLE 1

| Formula | YAG ($Y_3Al_5O_{12}$) | Spinel ($MgAl_2O_4$) Structure of the present disclosure |
|---|---|---|
| Crystal Structure | Cubic (a = 10.503 Å) | Cubic (a = 8.090 Å) |
| Polycrystalline or Single Crystal | Both | Both |
| Density (g/cm$^3$) | 4.56 | 3.58 |
| Band Gap (eV) | 4.495 | 5.122 |
| Melting Point (C.) | 2690 | 2135 |
| Flexural Strength (Mpa) | 172 | 200 |
| Hardness (Gpa) | 14 | 15 |
| Toughness (Mpa · m$^{1/2}$) | 1.2 | 1.2 |
| Thermal conductivity (W/mK) (RT) | 8.9 | 24.7 |
| Thermal conductivity (W/mK) (100° C.) | — | 14.8 |
| Thermal conductivity (W/mK) (1200° C.) | — | 5.4 |
| Coefficient of Thermal Expansion (×10$^{-6}$/K) | 6.1 | 7.3 |
| Electrical Resistivity (ohm · cm) (RT) | — | >10$^{14}$ |
| Electrical Resistivity (ohm · cm) (300° C.) | — | 5 × 10$^{14}$ |
| Electrical Resistivity (ohm · cm) (500° C.) | — | 2 × 10$^{14}$ |
| Electrical Resistivity (ohm · cm) (700° C.) | — | 4 × 10$^{14}$ |
| Dielectric Strength (KV/mm) | — | 580 |
| Dielectric Constant (1 MHz) | — | 8.2 |
| Loss Tangent (×10$^{-4}$) | — | 2 |

Note:
The sign "—" means not tested.

Referring to Table 1, in some embodiments, a flexural strength of the spinel structure 222 of the present disclosure is significantly greater than that of YAG. In some embodiments, a thermal conductivity of the spinel structure 222 of the present disclosure is significantly greater than that of YAG.

Figure 6:
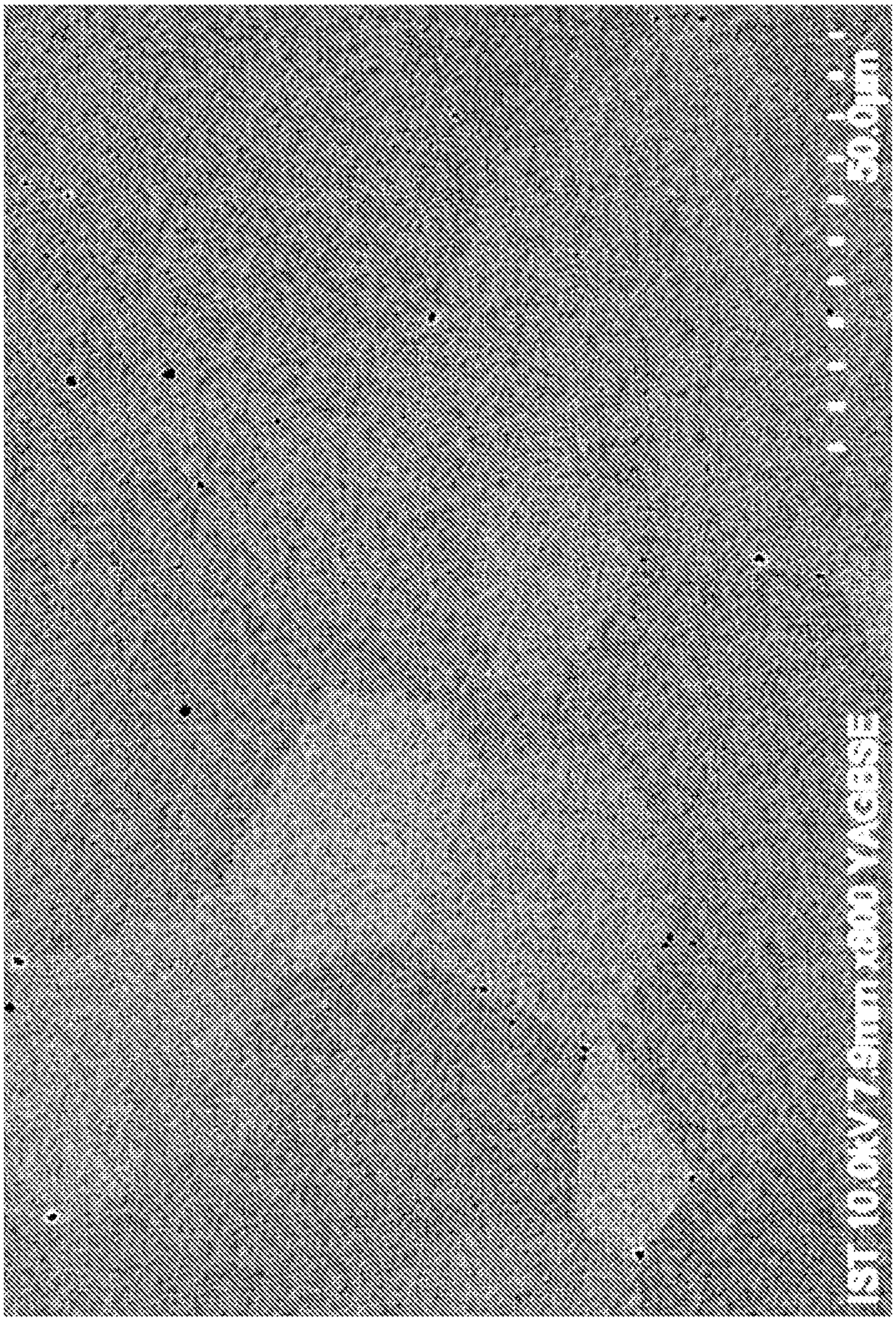
FIG. 6 is a photomicrograph of a portion of the ceramic article in accordance with some embodiments of the present disclosure.
Figure 7:
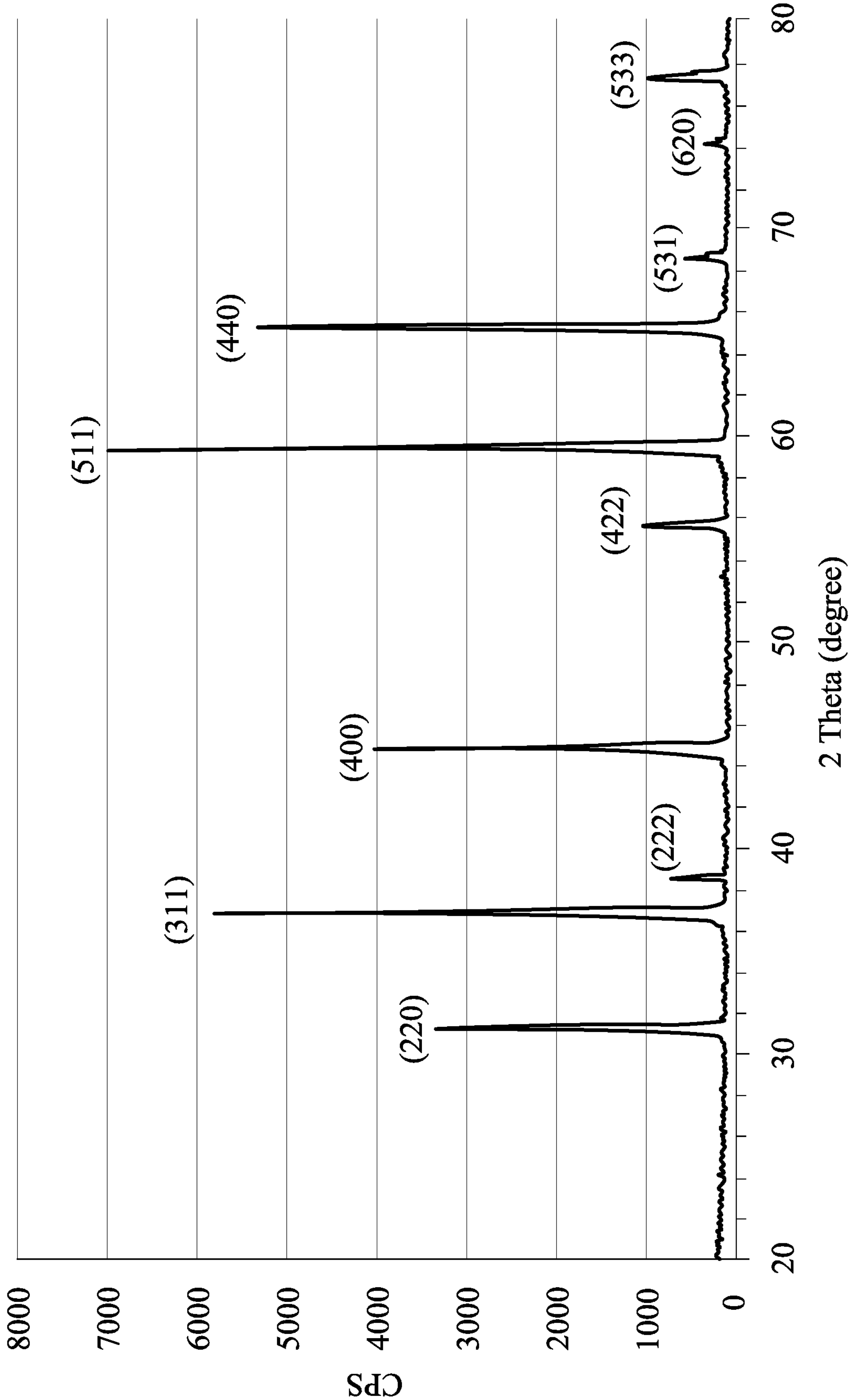
FIG. 7 is XRD diagrams of the portion of the ceramic article shown in FIG. 6 in accordance with some embodiments of the present disclosure.

FIG. 6 is a photomicrograph of the ceramic body 221 of the ceramic article 220 including the spinel structure 222 at a magnification of 800 times in accordance with some embodiments of the present disclosure. FIG. 7 is an XRD diagram of the ceramic body shown in FIG. 6 in accordance with some embodiments of the present disclosure.

In some embodiments, referring to FIGS. 6 and 7, the spinel structure 222 has a particle size ranging between 10 and 40 μm. In some embodiments, the spinel structure 222 has a porosity between 0.06 and 0.1 vol %. In some embodiments, the spinel structure 222 has a preferred crystal orientation (511). In some embodiments, the preferred crystal orientation (511) on a surface of the spinel structure 222 is perpendicular to a direction of the pressure P. In some embodiments, the spinel structure 222 is a pure cubic structure. In some embodiments, the spinel structure 222 with the preferred crystal orientation (511) is prepared by an SPS process for 15 minutes at the sintering temperature ranging between 1650 and 1750° C. and at the pressure P of 50 MPa.

Figure 8:
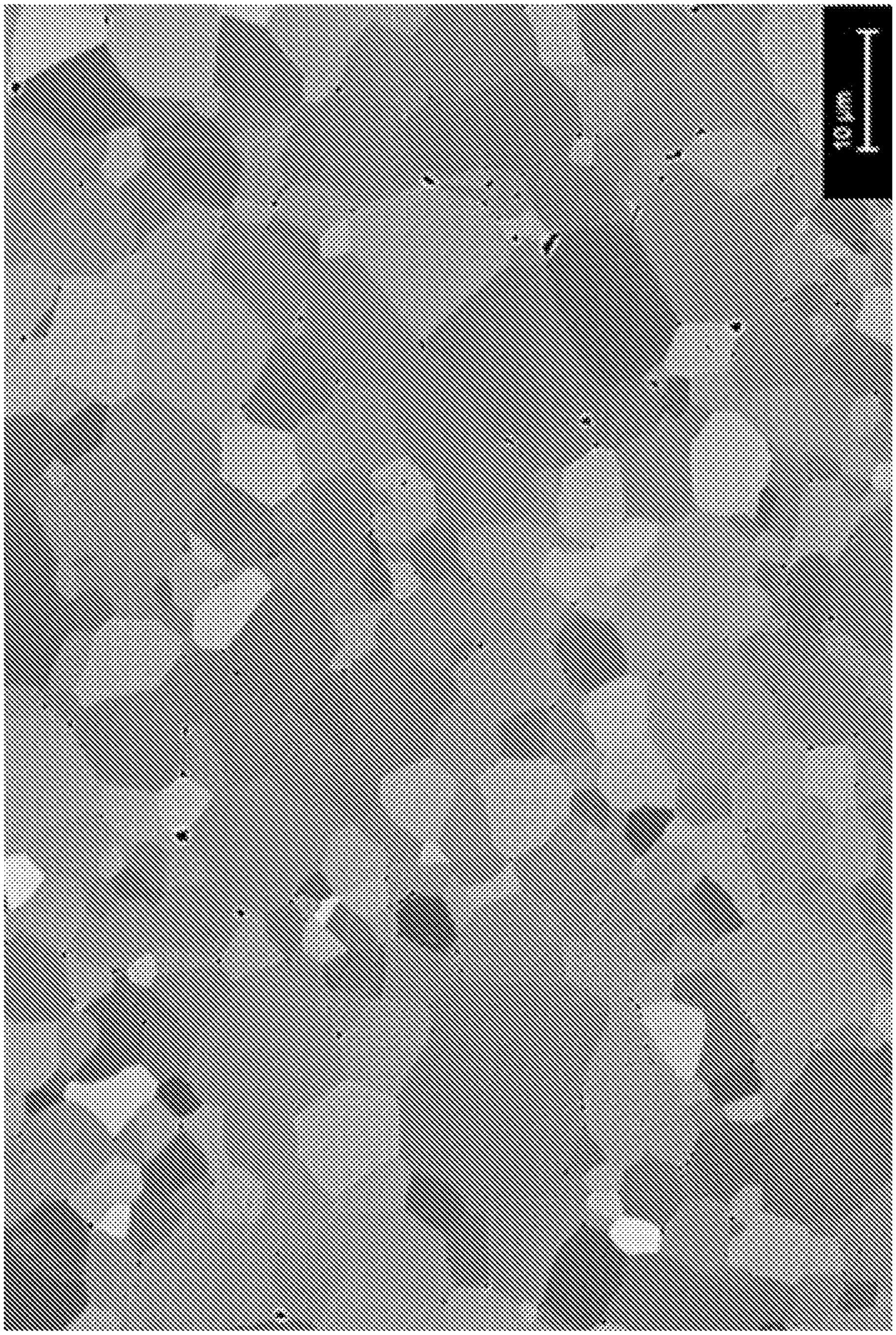
FIG. 8 is a photomicrograph of a portion of the ceramic article in accordance with some embodiments of the present disclosure.
Figure 9:
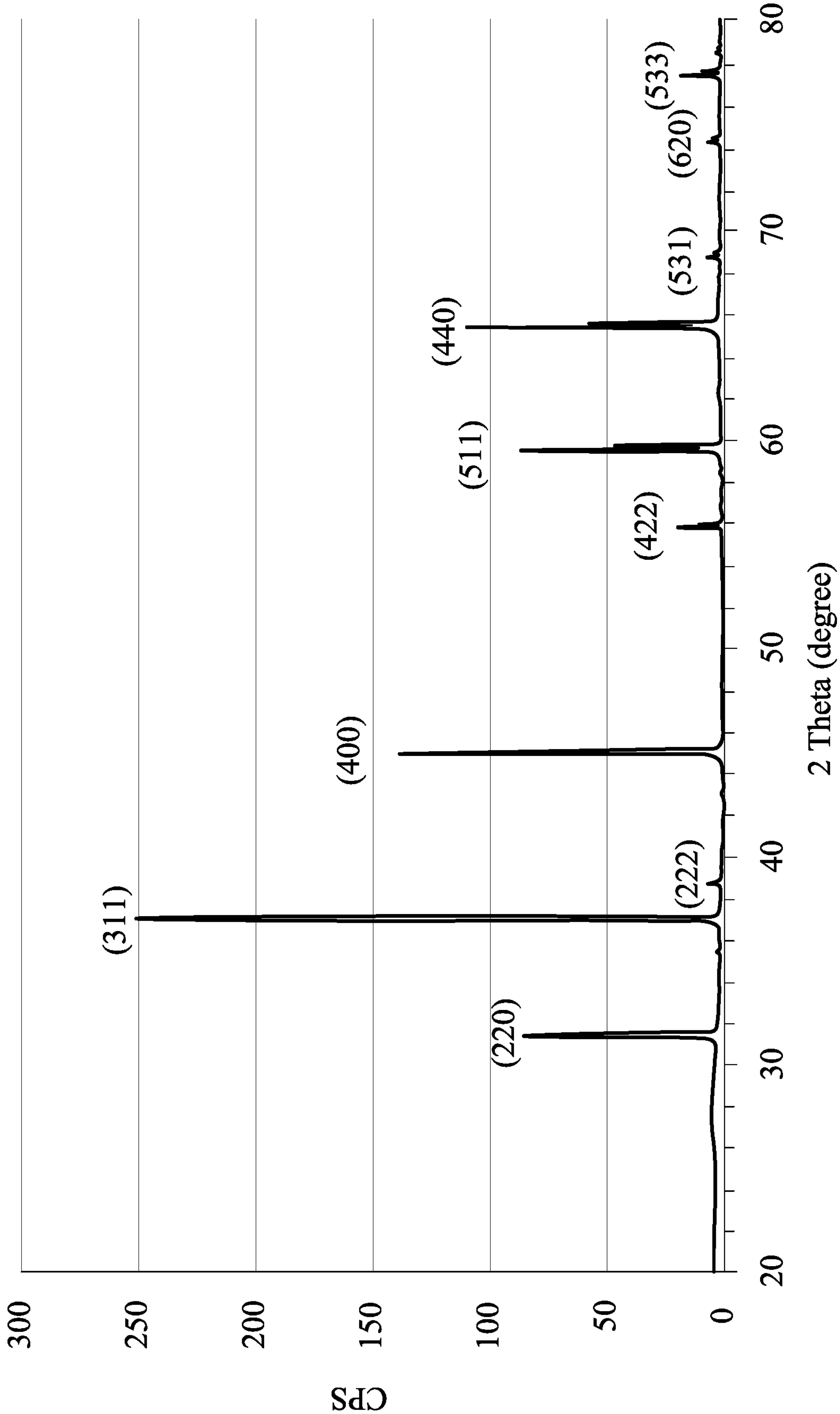
FIG. 9 is XRD diagrams of the portion of the ceramic article shown in FIG. 8 in accordance with some embodiments of the present disclosure.

FIG. 8 is photomicrograph of the ceramic body 221 of the ceramic article 220 including the spinel structure at a magnification of 1000 times in accordance with some embodiments of the present disclosure. FIG. 9 is an XRD diagram of the ceramic body shown in FIG. 8 in accordance with some embodiments of the present disclosure.

In some embodiments, referring to FIGS. 8 and 9, the spinel structure 222 has a particle size less than 10 μm. In some embodiments, the spinel structure 222 has a porosity between 0.1 and 0.3 vol %. In some embodiments, the spinel structure 222 has no preferred crystal orientation. In some embodiments, the spinel structure 222 with no preferred crystal orientation is prepared by an SPS process for 7 minutes at the sintering temperature ranging between 1550 and 1640° C. and at the pressure P of 50 MPa.

Figure 10:
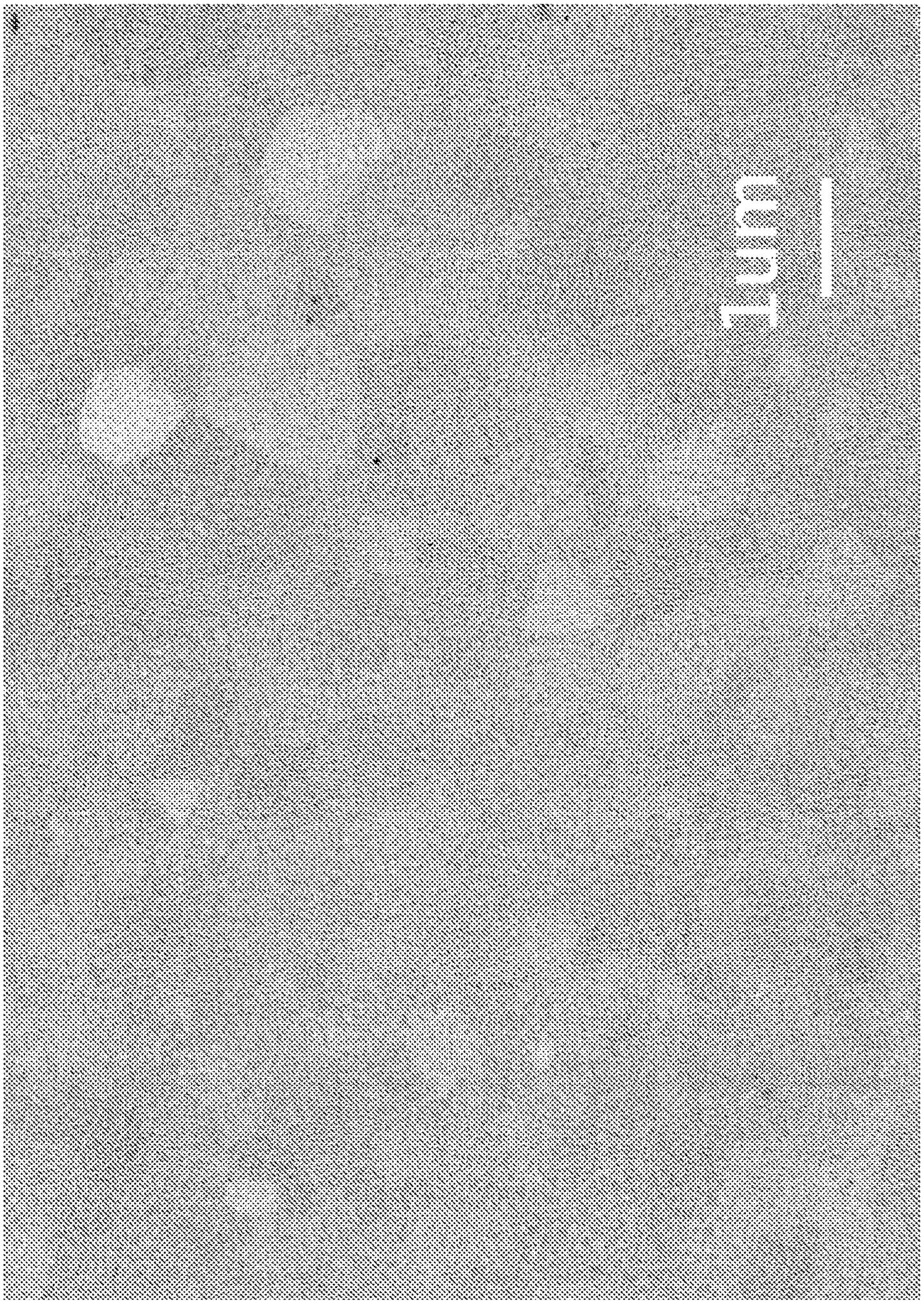
FIG. 10 is a photomicrograph of a portion of the ceramic article in accordance with some embodiments of the present disclosure.

FIG. 10 is photomicrograph of the ceramic body of the ceramic article including the spinel structure at a magnification of 1000 times in accordance with some embodiments of the present disclosure. In some embodiments, referring to FIG. 10, the spinel structure 222 has a particle size ranging between 0.3 and 1 μm. In some embodiments, the spinel structure 222 has a porosity between 0.3 and 0.5 vol %. In some embodiments, the spinel structure 222 has no preferred crystal orientation. In some embodiments, the spinel structure 222 with no preferred crystal orientation is prepared by an SPS process for 3 minutes at the sintering temperature ranging between 1350 and 1450° C. and at the pressure P of 50 MPa.

In some embodiments, the ceramic article 220 is a bulk ceramic article consisting essentially of the spinel structure 222. In some embodiments, the ceramic article 220 serves as a component of an apparatus for manufacturing a semiconductor structure. In some embodiments, the apparatus for manufacturing a semiconductor structure includes the ceramic article 220 including a spinel structure 222, wherein a ratio of a density of the spinel structure 222 to the theoretical density of a spinel is equal to or greater than 99.5%. In some embodiments, the ceramic article 220 prevents the performance decrease of the apparatus over time.

In some embodiments, the ceramic article 220 further includes a protective material applied as a coating layer (not shown) over a surface of the ceramic body 221. However, the coating layer of the ceramic article 220 may not be a best solution to avoid plasma erosion. The coating layer is constantly thinned due to erosion during a plasma etch process, and there is an increased risk that the ceramic article 220 beneath the coating will be attacked by plasma penetrating the coating layer. The coating layer may flake off during plasma etch processing due to residual stress. While such problems can be significantly reduced by using a coating of erosion-resistant materials, in many instances it may be advantageous to form a bulk article from plasma erosion-resistant materials. Therefore, the bulk ceramic article consisting essentially of the spinel structure 222 may decrease costs of manufacturing, reduce structural defects, and increase lifetime.

Figure 11:
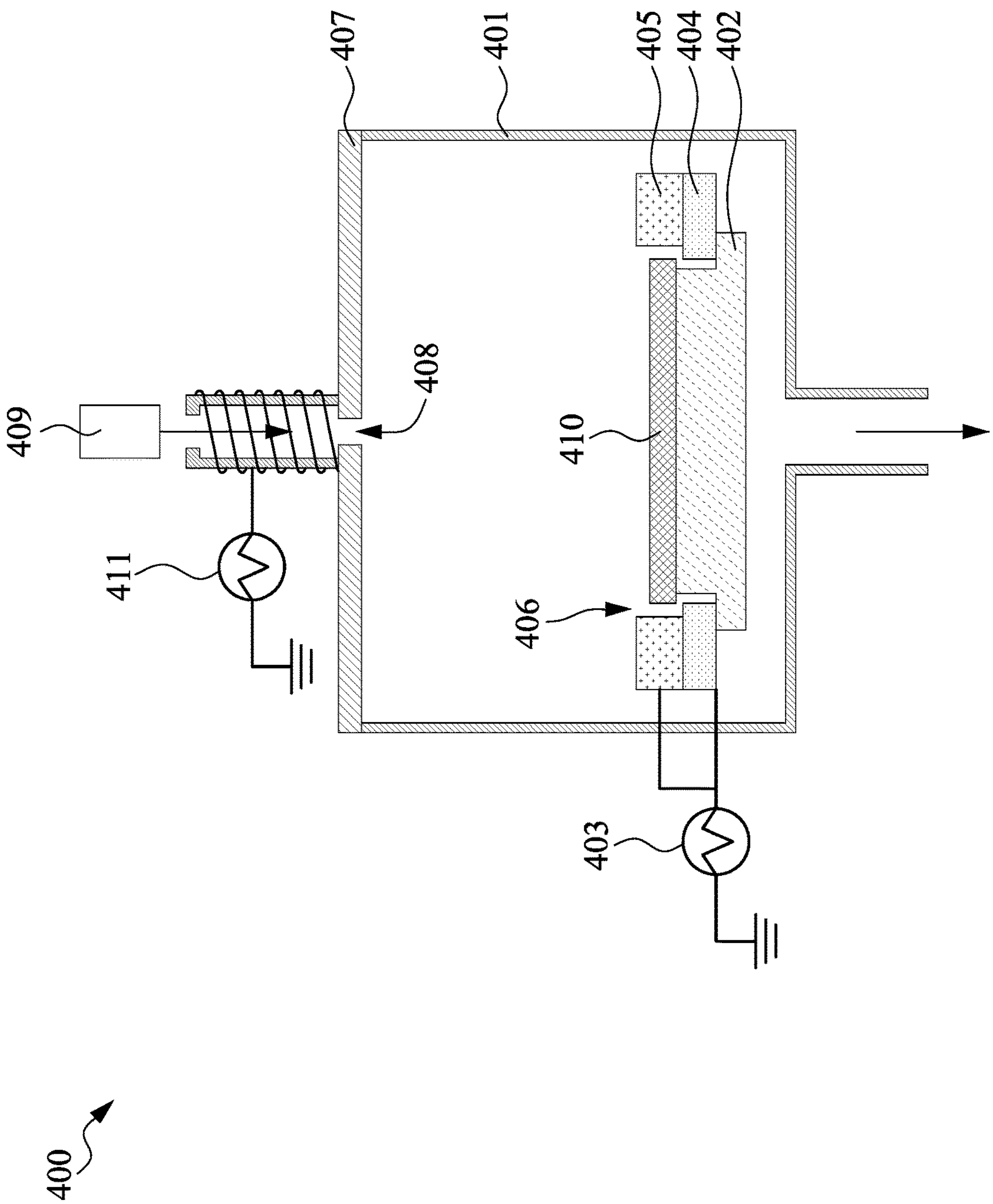
FIG. 11 is a schematic view of a semiconductor apparatus including a ceramic article in accordance with some embodiments of the present disclosure.

FIG. 11 is a schematic view of a semiconductor apparatus including a ceramic article 220 in accordance with some embodiments of the present disclosure. In some embodiments, the semiconductor apparatus is a plasma etcher 400. The plasma etcher 400 is a semiconductor apparatus that removes materials from a surface of a semiconductor device 410. The plasma etcher 400 may perform a dry (e.g., plasma) etching process on the semiconductor device 410. In some embodiments, the plasma etcher 400 includes a chamber 401 configured to receive a plasma and to process the semiconductor device 410 with the plasma. The chamber 401 may be sized and shaped depending on a size and a shape of the semiconductor device 410 to be processed by the plasma etcher 400.

In some embodiments, the semiconductor device 410 within the chamber 401 is disposed on an electrostatic chuck (ESC) 402. In some embodiments, the electrostatic chuck 402 is disposed in the chamber 401 and generates an attracting force between electrostatic chuck 402 and the semiconductor device 410 based on a voltage applied to the electrostatic chuck 402. The voltage may be provided from a first power supply 403 that provides a high bias voltage to the electrostatic chuck 402. The attractive force may cause the semiconductor device 410 to be retained on and supported by the electrostatic chuck 402 during processing of the semiconductor device 410. The electrostatic chuck 402 may be sized and shaped depending on a size and a shape of the semiconductor device 410 to be processed by the plasma etcher 400.

Figure 12:
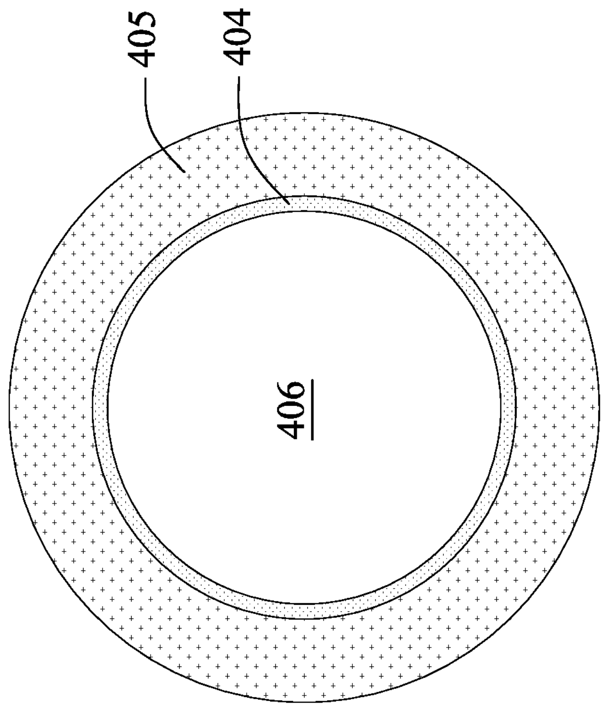
FIG. 12 is a schematic view of a portion of the semiconductor apparatus illustrated in FIG. 11 in accordance with some embodiments of the present disclosure.

FIG. 12 is a schematic view of a portion of the semiconductor apparatus illustrated in FIG. 11 in accordance with some embodiments of the present disclosure. In some embodiments, referring to FIGS. 11 and 12, a bottom ring 404 surrounds the electrostatic chuck 402, and an edge ring 405 disposed on the bottom ring 404 surrounds the electrostatic chuck 402 and the semiconductor device 410. In some embodiments, the edge ring 405 provides electrical and plasma fluid uniformity for the semiconductor device 410 being processed by the plasma etcher 400. A high bias voltage is applied to the edge ring 405 (e.g., from the first power supply 403) so that the edge ring 405 may provide the electrical and plasma uniformity. The edge ring 405 may be sized and shaped depending on the size and the shape of the semiconductor device 410 to be processed by the plasma etcher 400. For example, the edge ring 405 may be circular and may include an opening 406 to enable the edge ring 405 to surround the semiconductor device 410 and the electrostatic chuck 402. In some embodiments, the edge ring 405 is a ceramic article 220 which includes the spinel structure 222, wherein the ratio of the density of the spinel structure 222 to the theoretical density of the spinel is greater than 99.5%.

In some embodiments, the bottom ring 404 may be sized and shaped depending on the size and the shape of the semiconductor device 410 to be processed by the plasma etcher 400 and the size and the shape of the edge ring 405. For example, the bottom ring 404 may be circular to surround the electrostatic chuck 402. In some embodiments, the bottom ring 404 is a ceramic article 220 which includes the spinel structure 222, wherein the ratio of the density of the spinel structure 222 to the theoretical density of the spinel is greater than 99.5%.

In some embodiments, referring back to FIG. 11, a transfer-coupled plasma window (TCP window) 407 is disposed on the edge ring 405 and the semiconductor device 410 being processed by the plasma etcher 400. In some embodiments, the TCP window 407 includes an inlet 408 for allowing a plasma gas to enter the chamber 401. In some embodiments, an injector 409 is disposed over the TCP window 407 and configured to provide the plasma gas toward the inlet 408. In some embodiments, a high frequency electric field (e.g., provided by a second power supply 411) is applied to the plasma gas via the inlet 408, and the plasma gas passes through the inlet 408 of the TCP window 407 and is converted to the plasma. The TCP window 407 may be sized and shaped depending on the size and the shape of the chamber 401 of the plasma etcher 400. In some embodiments, the TCP window 407 is a ceramic article 220 which includes the spinel structure 222, wherein the ratio of the density of the spinel structure 222 to the theoretical density of the spinel is greater than 99.5%. In some embodiments, the injector 409 is a ceramic article 220 which includes the spinel structure 222, wherein the ratio of the density of the spinel structure 222 to the theoretical density of the spinel is greater than 99.5%. In some embodiments, the ceramic article 220 includes the injector 409, the TCP window 407, the edge ring 405, and/or the bottom ring 404.

Figure 13:
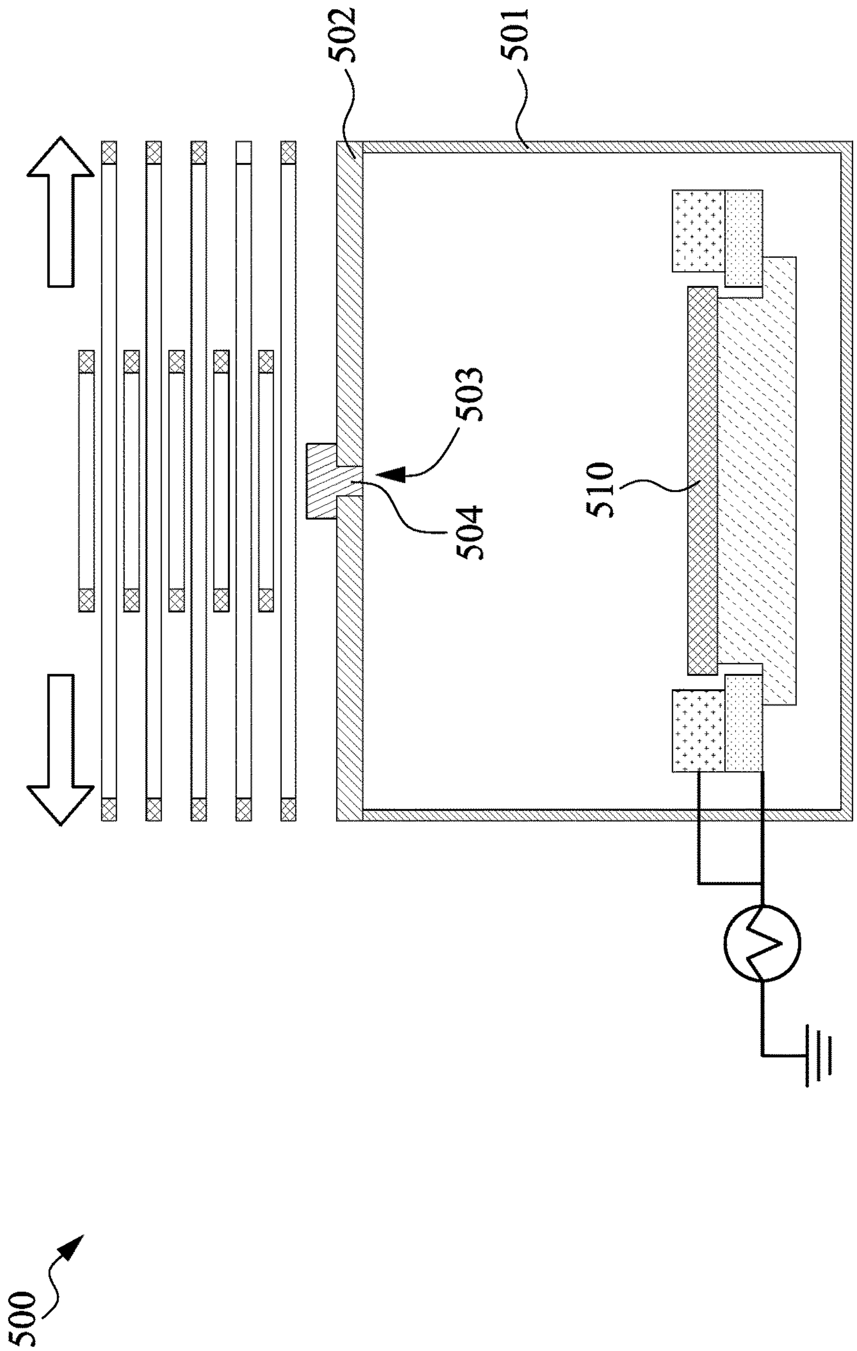
FIGS. 13 to 15 are schematic views of a semiconductor apparatus including a ceramic article in accordance with some embodiments of the present disclosure.

FIG. 13 is a schematic view of a semiconductor apparatus including a ceramic article 220 in accordance with some embodiments of the present disclosure. In some embodiments, a plasma etcher 500 includes a lid 502 disposed over a chamber 501. In some embodiments, the lid 502 includes an opening 503, and a nozzle 504 configured to provide plasma to a semiconductor device 510 being processed by the plasma etcher 500 is disposed within the opening 503 of the lid 502. The lid 502 may be sized and shaped depending on the size and the shape of the chamber 501 of the plasma etcher 500. In some embodiments, the lid 502 is a ceramic article 220 which includes the spinel structure 222, wherein the ratio of the density of the spinel structure 222 to the theoretical density of the spinel is greater than 99.5%. The nozzle 504 may be sized and shaped depending on the size and the shape of the lid 502 of the plasma etcher 500. In some embodiments, the nozzle 504 is a ceramic article 220 which includes the spinel structure 222, wherein the ratio of the density of the spinel structure 222 to the theoretical density of the spinel is greater than 99.5%. In some embodiments, the ceramic article 220 includes the lid 502 and/or the nozzle 504.

Figure 14:
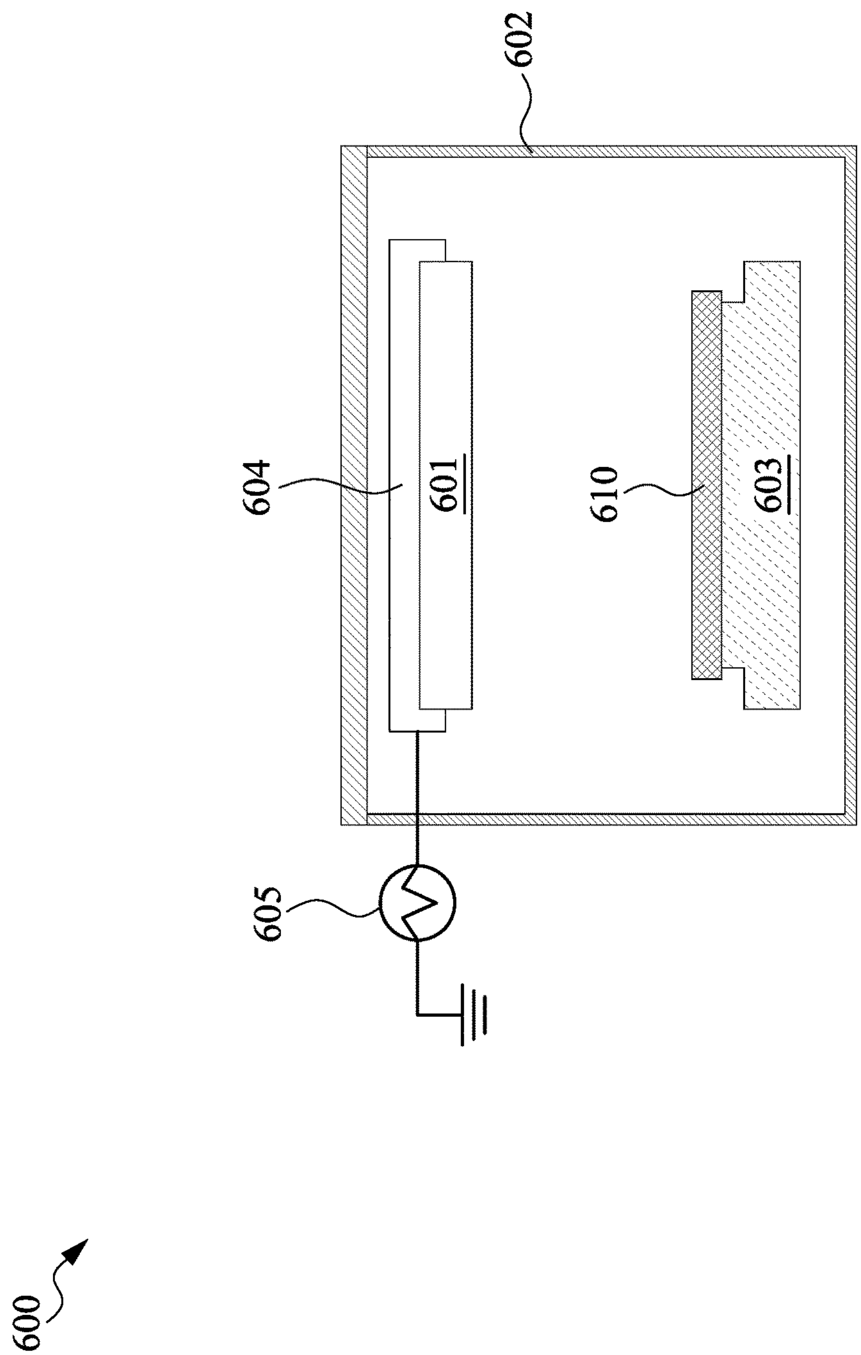

FIG. 14 is a schematic view of a semiconductor apparatus including a ceramic article 220 in accordance with some embodiments of the present disclosure. In some embodiments, an etch reactor 600 includes a showerhead 601 disposed in a chamber 602 and an electrostatic chuck 603 for retaining a semiconductor device 610 beneath the showerhead 601. The showerhead 601 includes a plurality of channels configured to supply gas into the chamber 602. In some embodiments, the showerhead 601 is mounted to an upper electrode 604 opposite to the electrostatic chuck 603, and the upper electrode 604 is coupled to a power supply 605. The showerhead 601 may be sized and shaped depending on the size and the shape of the chamber 602 of the etch reactor 600. In some embodiments, the showerhead 601 is a ceramic article 220 which includes the spinel structure 222, wherein the ratio of the density of the spinel structure 222 to the theoretical density of the spinel is greater than 99.5%. In some embodiments, the ceramic article 220 is the showerhead 601.

Figure 15:
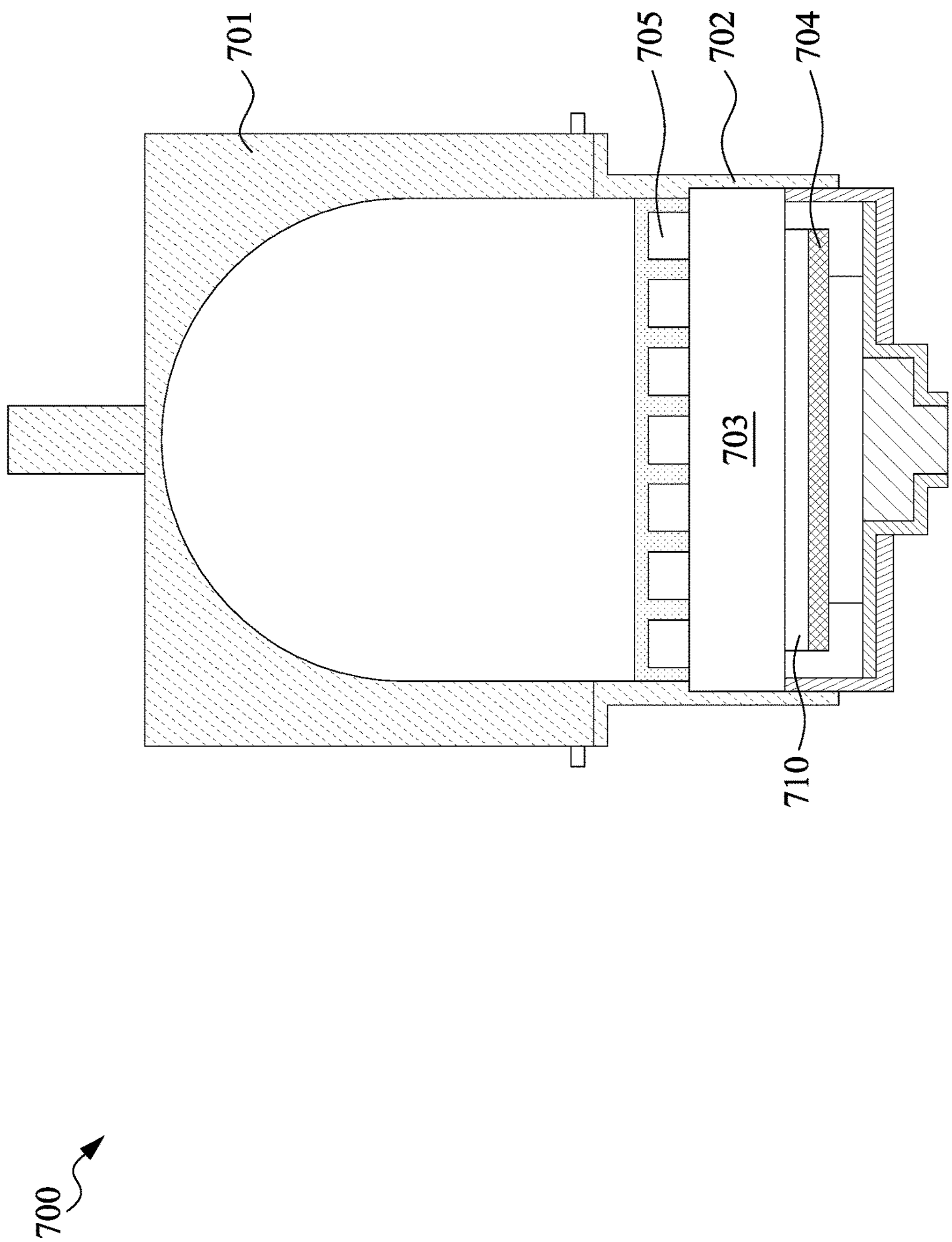

FIG. 15 is a schematic view of a semiconductor apparatus including a ceramic article 220 in accordance with some embodiments of the present disclosure. In some embodiments, a flowable chemical vapor deposition apparatus 700 includes a dome 701, a sidewall 702, and a process space 703 defined by the dome 701 and the sidewall 702. In some embodiments, an electrostatic chuck 704 for retaining a semiconductor device 710 is disposed in the process space 703. In some embodiments, a showerhead 705 including a plurality of channels is disposed within the process space 703 and over the semiconductor device 710. The dome 701 may be sized and shaped depending on the size and the shape of the sidewall 702 of the flowable chemical vapor deposition apparatus 700. In some embodiments, the dome 701 is a ceramic article 220 which includes the spinel structure 222, wherein the ratio of the density of the spinel structure 222 to the theoretical density of the spinel is greater than 99.5%. In some embodiments, the ceramic article 220 is the dome 701.

EXAMPLES

The ceramic article 220 including a spinel structure 222 of the present invention will be described in detail hereinafter using practical examples and comparative examples. However, the present invention is not limited by the description of the practical examples listed below.

Practical Example 1

A ceramic article 220 including a spinel structure 222 with the preferred crystal orientation (511) is prepared by an SPS process for 15 minutes at the sintering temperature of 1700° C. and at the pressure P of 50 MPa.

Practical Example 2

A ceramic article 220 including a spinel structure 222 with no preferred crystal orientation is prepared by an SPS process for 7 minutes at the sintering temperature of 1600° C. and at the pressure P of 50 MPa.

Comparative Example 1

A ceramic article 220 including $Y_2O_3$ film.

Erosion-Resistant Test

Each of samples of the ceramic articles is separated into two portions. A first portion (a left portion) of the sample is exposed, and a second portion (a right portion) of the sample has a PI tape attached thereto. Each test sample undergoes a plasma etch process having the following conditions:

Plasma: $CF_4$/Ar;
Source power: 800_;
Bias: 400 W;
Flow rate: 500 sccm;
Pressure: 4 mtorr; and
Time: 2700 seconds.

Figure 16C:
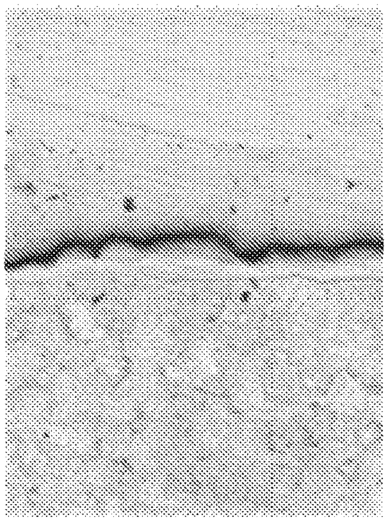
FIGS. 16A to 16C are photographs illustrating test results of Practical Examples 1 and 2 and Comparative Example 1 respectively.
Figure 16B:
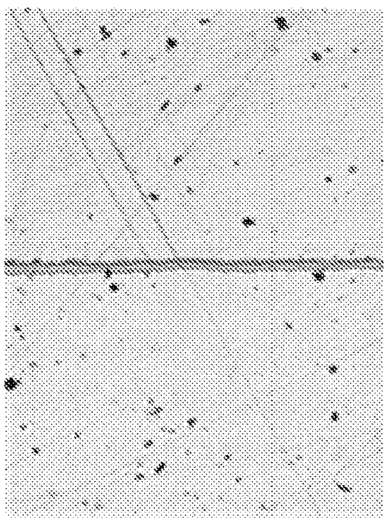
Figure 16A:
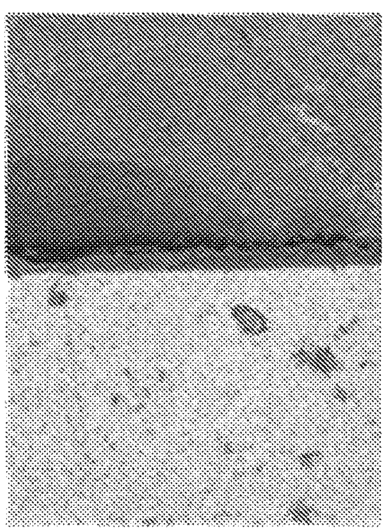

After the plasma etch process, roughnesses of the first portions and the second portions are measured, and etch depths of each sample are calculated based on the corresponding roughnesses. The test results are listed in Table 2 and illustrated in FIGS. 16A to 16C.

TABLE 2

| Sample | Type | Roughness Ra (μm) First portion | Roughness Ra (μm) Second portion | Etch depth (times) |
|---|---|---|---|---|
| Practical Example 1 | Spinel | 0.23 | 0.232 | 1 |
| Practical Example 2 | Spinel | 0.213 | 0.21 | 1 |
| Comparative Example 1 | $Y_2O_3$ | 0.241 | 0.221 | 1.6 |

According to Table 2, the roughness of the first portion (etched by plasma) of the Comparative Example 1 is greater than the roughness of the second portion (covered by PI tape) of the Comparative Example 1. Accordingly, it can be seen that the first portion of the Comparative Example 1 is etched. The roughness of the first portion of the Practical Example 1 is similar to the roughness of the second portion of the Practical Example 1. Similar test results are observed with the Practical Example 2. As such, the plasma erosion resistance of the spinel structure 222 of the present disclosure is greater than that of the $Y_2O_3$ film.

Some embodiments of the present disclosure provide a ceramic article. The ceramic article includes a ceramic body including a spinel ($MgAl_2O_4$) structure, wherein a ratio of a density of the spinel structure to a theoretical density of a spinel is greater than 99.5%.

In some embodiments, the ceramic body is prepared by a spark plasma sintering process. In some embodiments, the spinel structure has a preferred grain orientation (511). In some embodiments, the ceramic article is a bulk ceramic article consisting essentially of the spinel structure. In some embodiments, a grain size of the spinel ($MgAl_2O_4$) structure is between 0.1 and 50 μm. In some embodiments, a porosity of the ceramic body is less than 0.5%.

Some embodiments of the present disclosure provide a semiconductor apparatus for manufacturing a semiconductor structure. The semiconductor apparatus includes a ceramic article including a spinel ($MgAl_2O_4$) structure, wherein a ratio of a density of the spinel structure to a theoretical density of a spinel is greater than 99.5%.

In some embodiments, the ceramic article is prepared by a spark plasma sintering process. In some embodiments, the ceramic article is an injector, a transformer-coupled plasma window, an edge ring, a bottom ring, a nozzle, a lid, a shower head, or a dome.

Some embodiments of the present disclosure provide a method of manufacturing a ceramic article. The method includes: providing a green body; heating the green body to a sintering temperature; compressing the green body; applying an electrical pulse to the green body; and forming a ceramic body including a spinel ($MgAl_2O_4$) structure after heating, compressing and applying the electrical pulse to the green body.

In some embodiments, the electrical pulse is applied to the green body intermittently, and the green body is heated due to receiving the electrical pulse while being compressed at a same time. In some embodiments, the method further includes positioning the green body in a die, wherein the die includes graphite. In some embodiments, the method further includes starting a spark plasma sintering process to sinter the green body; and ending the spark plasma sintering process after the ceramic body is formed. In some embodiments, the green body includes a magnesium source and an aluminum source. In some embodiments, the green body is heated while being compressed for less than 130 minutes. In some embodiments, the sintering temperature is between 1200 and 1800° C. In some embodiments, the electrical pulse is a DC pulse having a current between 0.1 and 11 kA. In some embodiments, a pressure of the compression of the green body is between 5 and 100 MPa. In some embodiments, the sintering temperature is between 1650 and 1750° C., and the spinel ($MgAl_2O_4$) structure has a particle size between 10 and 40 μm and a preferred crystal orientation (511). In some embodiments, the sintering temperature is between 1550 and 1640° C., and the spinel ($MgAl_2O_4$) structure has a particle size less than 10 μm and has no preferred orientation.

The foregoing outlines structures of several embodiments so that those skilled in the art may better understand aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A ceramic article, comprising:

a ceramic body including a spinel ($MgAl_2O_4$) structure, wherein a ratio of a density of the spinel structure to a theoretical density of a spinel is greater than 99.5%, and wherein an X-ray diffraction (XRD) diagram of the ceramic body shows that the spinal structure has a highest peak crystal orientation (511).

2. The ceramic article of claim 1, wherein the ceramic body is prepared by a spark plasma sintering process.

3. The ceramic article of claim 1, wherein the ceramic article is a bulk ceramic article consisting essentially of the spinel structure.

4. The ceramic article of claim 1, wherein a grain size of the spinel ($MgAl_2O_4$) structure is between 10 and 40 μm.

5. The ceramic article of claim 1, wherein a porosity of the ceramic body is less than 0.5%.

6. The ceramic article of claim 1, wherein a porosity of the ceramic body is between 0.06 and 0.1 vol %.

7. A semiconductor apparatus for manufacturing a semiconductor structure, comprising:

a ceramic article including a ceramic body with a spinel ($MgAl_2O_4$) structure, wherein a ratio of a density of the spinel structure to a theoretical density of a spinel is greater than 99.5%, and wherein an X-ray diffraction (XRD) diagram of the ceramic body shows that the spinal structure has a highest peak crystal orientation (511).

8. The semiconductor apparatus of claim 7, wherein the ceramic article is prepared by a spark plasma sintering process.

9. The semiconductor apparatus of claim 7, wherein the ceramic article is an injector, a transformer-coupled plasma window, an edge ring, a bottom ring, a nozzle, a lid, a shower head, or a dome.

10. A method of manufacturing a ceramic article, comprising:

providing a green body;

heating the green body to a sintering temperature;

compressing the green body;

applying an electrical pulse to the green body; and forming a ceramic body including a spinel ($MgAl_2O_4$) structure after heating, compressing and applying the electrical pulse to the green body, wherein an X-ray diffraction (XRD) diagram of the ceramic body shows that the spinal structure has a highest peak crystal orientation (511).

11. The method of claim 10, wherein the electrical pulse is applied to the green body intermittently, and the green body is heated due to receiving the electrical pulse while being compressed at a same time.

12. The method of claim 10, further comprising:

positioning the green body in a die, wherein the die includes graphite.

13. The method of claim 10, further comprising:

starting a spark plasma sintering process to sinter the green body; and ending the spark plasma sintering process after the ceramic body is formed.

14. The method of claim 10, wherein the green body includes a magnesium source and an aluminum source.

15. The method of claim 10, wherein the green body is heated while being compressed for less than 130 minutes.

16. The method of claim 10, wherein the sintering temperature is between 1200 and 1800° C.

17. The method of claim 10, wherein the electrical pulse is a DC pulse having a current between 0.1 and 11 kA.

18. The method of claim 10, wherein a pressure of the compression of the green body is between 5 and 100 MPa.

19. The method of claim 10, wherein the sintering temperature is between 165° and 1750° C., and the spinel ($MgAl_2O_4$) structure has a particle size between 10 and 40 μm.

20. The method of claim 10, wherein a porosity of the ceramic body is between 0.06 and 0.1 vol %.

* * * * *